(12) United States Patent
Tokie et al.

(10) Patent No.: US 8,318,552 B2
(45) Date of Patent: Nov. 27, 2012

(54) METHOD FOR FORMING GATE STRUCTURES

(75) Inventors: Jeffrey H. Tokie, Scandia, MN (US); Michael A. Haase, St. Paul, MN (US); Robert J. Schubert, Cedar Park, TX (US); Michael W. Bench, Eagan, MN (US); Donald J. McClure, Siren, WI (US); Grace L. Ho, Shanghai (CN)

(73) Assignee: 3M Innovative Properties Company, St. Paul, MN (US)

( * ) Notice: Subject to any disclaimer, the term of this patent is extended or adjusted under 35 U.S.C. 154(b) by 219 days.

(21) Appl. No.: 12/665,094

(22) PCT Filed: May 20, 2008

(86) PCT No.: PCT/US2008/064181
§ 371 (c)(1),
(2), (4) Date: Jun. 22, 2010

(87) PCT Pub. No.: WO2009/005902
PCT Pub. Date: Jan. 8, 2009

(65) Prior Publication Data
US 2010/0252176 A1    Oct. 7, 2010

Related U.S. Application Data

(60) Provisional application No. 60/946,734, filed on Jun. 28, 2007.

(51) Int. Cl.
*H01L 21/677*    (2006.01)
*H01L 27/12*    (2006.01)
*H01L 29/49*    (2006.01)
*H01L 29/786*    (2006.01)

(52) U.S. Cl. ........ 438/158; 205/137; 205/157; 205/333; 438/771; 438/785

(58) Field of Classification Search .................. 438/150, 438/479, 778; 156/150; 205/333, 316, 80
See application file for complete search history.

(56) References Cited

U.S. PATENT DOCUMENTS 3,643,670 A    2/1972   Sabatka
(Continued)

FOREIGN PATENT DOCUMENTS

JP    10-037000    2/1998
(Continued)

OTHER PUBLICATIONS

Arai, "Nanostructure and Electrical Priorities of Anodized AL Gate Insulators for Thin-film Transistors", Mat. Res. Soc. Symp. Proc., 1997, vol. 242, pp. 37-42.
(Continued)

*Primary Examiner* — Olik Chaudhuri
*Assistant Examiner* — Wilner Jean Baptiste
(74) *Attorney, Agent, or Firm* — Steven E. Skolnick

(57) ABSTRACT

A process for forming gate structures is described. A web comprises a substrate, a plurality of conductive elements disposed on the substrate, and a conductive anodization bus. The web is moved through an anodization station to form a plurality of gate structures comprising a plurality of gate dielectrics adjacent to a plurality of gate electrodes. A process for forming electronic devices further providing a semiconductor, a source electrode, and a drain electrode is described.

23 Claims, 5 Drawing Sheets

U.S. PATENT DOCUMENTS

| | | | |
|---|---|---|---|
| 4,683,643 A | | 8/1987 | Nakajima |
| 4,865,699 A | | 9/1989 | Fromson |
| 4,942,441 A | | 7/1990 | Konishi |
| 5,503,731 A | * | 4/1996 | Konuma et al. ............... 205/98 |
| 6,267,861 B1 | | 7/2001 | Kinard |
| 6,329,226 B1 | | 12/2001 | Jones |
| 6,335,773 B1 | | 1/2002 | Kamei |
| 6,433,359 B1 | | 8/2002 | Kelley |
| 6,563,174 B2 | | 5/2003 | Kawasaki |
| 6,617,609 B2 | | 9/2003 | Kelley |
| 6,667,215 B2 | | 12/2003 | Theiss |
| 6,946,676 B2 | | 9/2005 | Kelley |
| 6,998,068 B2 | | 2/2006 | Gerlach |
| 7,098,525 B2 | | 8/2006 | Bai |
| 7,208,756 B2 | | 4/2007 | Shih |
| 7,276,395 B2 | | 10/2007 | Gerlach |
| 7,655,127 B2 | | 2/2010 | Bench |
| 7,868,410 B2 | * | 1/2011 | Vereecken et al. ............ 257/499 |
| 2006/0091793 A1 | | 5/2006 | Baude |
| 2006/0228974 A1 | | 10/2006 | Thelss |
| 2008/0011225 A1 | | 1/2008 | McClure |
| 2008/0095985 A1 | | 4/2008 | Frey |
| 2008/0095988 A1 | | 4/2008 | Frey |
| 2008/0121877 A1 | | 5/2008 | Ender |
| 2008/0150148 A1 | | 6/2008 | Frey |
| 2008/0171422 A1 | | 7/2008 | Tokie |

FOREIGN PATENT DOCUMENTS

| | | |
|---|---|---|
| WO | WO 02/21613 | 3/2002 |
| WO | WO 2009/005902 | 1/2009 |

OTHER PUBLICATIONS

Arai, "Annealing Effects of Anodized Al-based Alloy for Thin-film Transistors", Thin Solid Films, 1998, vol. 318, pp. 257-261.

Bao, "Materials and Fabrication Needs for Low-cost Organic Transistor Circuits", Adv. Mater., 2000, vol. 12, No. 3, pp. 227-230.

Carcia, "Oxide Engineering of ZnO Thin-film Transistors for Flexible Electronics", Journal of the SID, 2005, vol. 13, No. 7, pp. 547-554.

Gan, "Thin Film Transistors with Anodic Gate Dielectrics and Chemical Bath Deposited Active Layers", J. Vac. Sci. Technol. A, Jul./Aug. 2002, vol. 20, No. 4, pp. 1365-1368.

Hsieh, "Scaling Behavior of ZnO Transparent Thin-film Transistors", Applied Physics Letters, 2006, vol. 89, No. 041109, pp. 041109-1-491109-3.

Kallfass, "High Voltage Thin Film Transistors Manufactured with Photolithography and with $Ta_2O_5$ as the Gate Oxide", Thin Solid Films, 1979, vol. 61, pp. 259-264.

Majewski, "High Capacitance Organic Field-effect Transistors with Modified Gate Insulator Surface", Journal of Appl. Phys., Nov. 15, 2004, vol. 96, No. 10, pp. 5781-5787.

Masuda, "Transparent Thin Film Transistors using ZnO as an Active Channel Layer and their Electrical Properties", Jour. App. Phys., Feb. 1, 2003, vol. 93, No. 3, pp. 1624-1630.

Randolph, "Commercial Assessment of Roll-to-Roll Manufacturing of Electrical Displays", Thesis. Tennessee Technological University, 2005. Cambridge, MA, Massachusetts Institute of Technology, Sep. 2006, pp. 1-81.

Tate, "Anodization and Microcontact Printing on Electroless Silver: Solution-based Fabrication Procedures for Low-voltage Electronic Systems with Organic Active Components", Langmuir, 2000, vol. 16, pp. 6054-6060.

Ue, "Anodization of Al-Nd Alloy Films in Nonaqueous Electrolyte Solutions for TFT-LCD Application", Electrochimica Acta, 2001, vol. 47, pp. 217-223.

Yang, "Low-voltage Organic Transistors on a Polymer Substrate with an Aluminum Foil Gate Fabricated by a Laminating and Electropolishing Process", Applied Physics Letters, Oct. 9, 2006, vol. 89, No. 153508, pp. 153508-1-153508-3.

International Written Opinion for PCT Application PCT/US2008/064181, 3 pages.

International Search Report for PCT Application No. PCT/US2008/064181, 3 pages.

Ext. Search Report for EP Application No. 08755917, 6 pages.

* cited by examiner

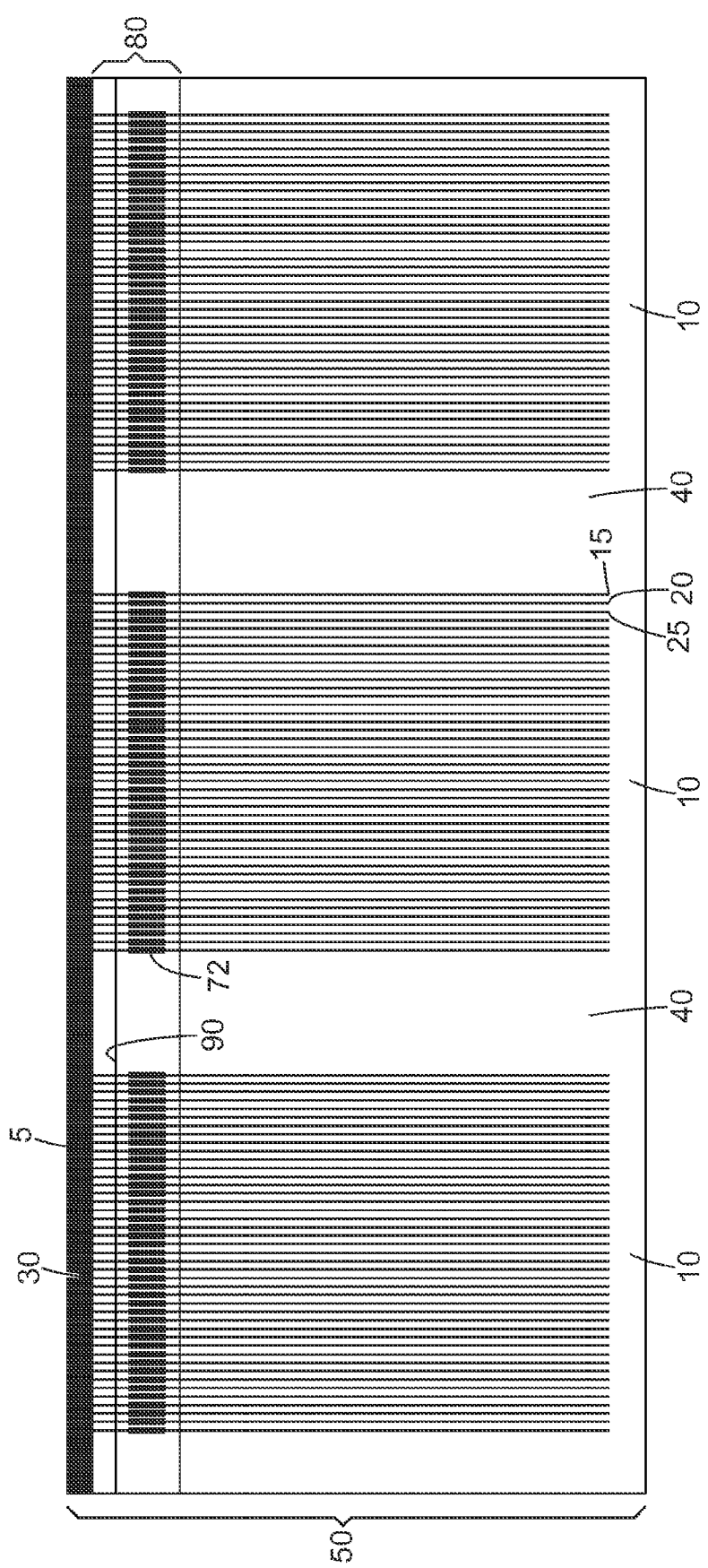

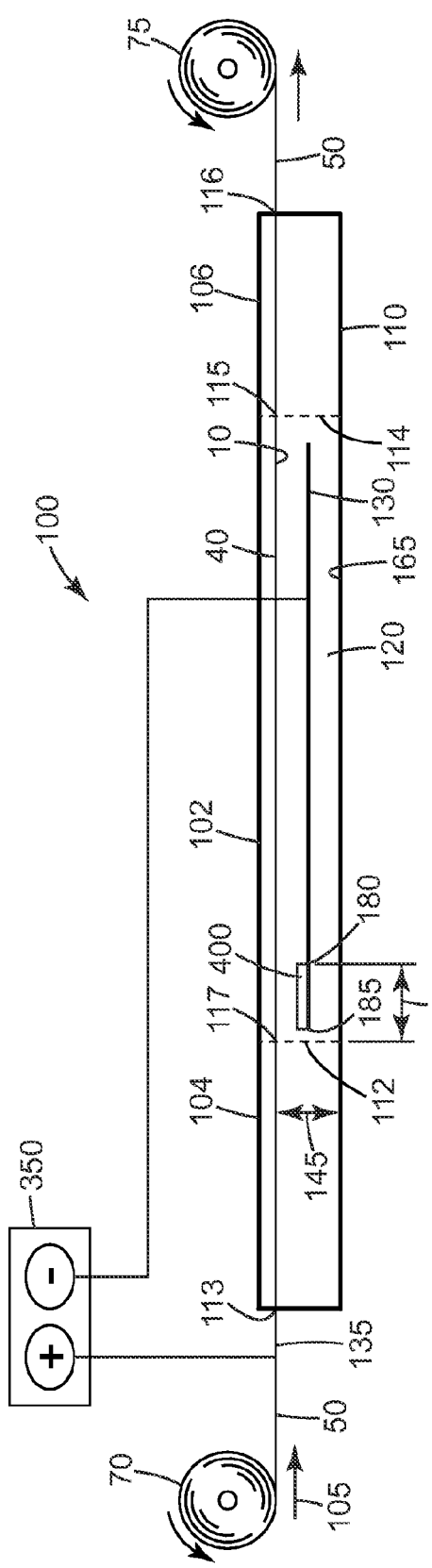
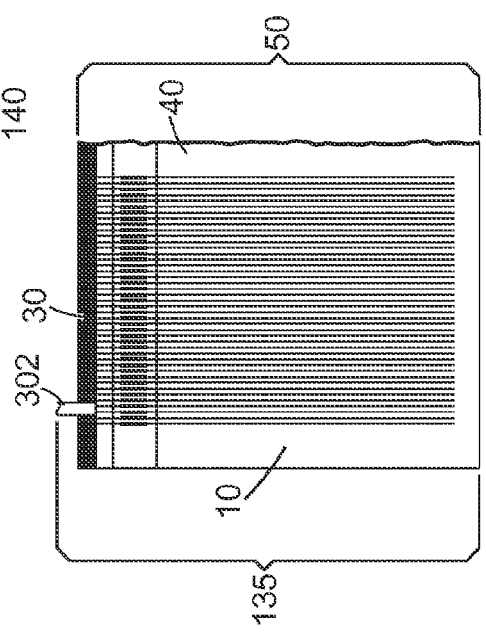

METHOD FOR FORMING GATE STRUCTURES

CROSS REFERENCE TO RELATED APPLICATIONS

This application is a national stage filing under 35 U.S.C. 371 of PCT/US2008/064181, filed May 20, 2008, which claims priority to U.S. Provisional Application No. 60/946,734, filed Jun. 28, 2007, the disclosure of which is incorporated by reference in its/their entirety herein.

FIELD

The present disclosure relates to processes for forming a plurality of gate structures, and for forming a plurality of electronic devices.

BACKGROUND

Conductive materials can be used as gate electrodes in electronic devices as well as in other applications. For example, these materials may be deposited and optionally patterned on a substrate prior to coating or deposition of a dielectric material to form an electronic device.

Many electronic devices include a conductive gate electrode adjacent to a gate dielectric. Gate dielectrics act as insulators in electronic devices. Conductive materials can be coated with a dielectric or anodized for forming a gate dielectric adjacent to a gate electrode. Anodizable metals may be oxidized by traditional routes to develop porous or nonporous dielectric layers.

Nonporous or barrier dielectric layers are generally produced anodically in electrolyte solutions, which are relatively noncorrosive toward the conductive metal upon which the dielectric layer is grown. High quality dielectric layers generally are free of pin-holes, and have low leakage current, high breakdown field, and resistance to charge trapping. Barrier dielectric films generally are uniform in thickness.

Anodization of conductive materials, for example as metals, to form dielectric layers can be accomplished in a batch process. The conductive material may be immersed in an electrolyte solution at a certain temperature. An applied voltage can be applied to the electrolyte solution for a period of time to form a dielectric layer on the conductive material as described, for example, in U.S. Pat. No. 6,267,861 (Kinard et al.).

The formation of dielectric layers on anodizable materials may be used for numerous applications in electronic devices including electrolytic capacitors, rectifiers, transistors, diodes, light emitting devices, resistors, and combinations thereof.

SUMMARY

The present disclosure describes processes for forming a plurality of gate structures by anodizing a plurality of conductive elements on a substrate of a moving web. Anodization of a portion of the surface of the plurality of conductive elements results in a plurality of gate structures that contain a plurality of gate dielectrics adjacent to a plurality of gate electrodes. A process for forming electronic devices is disclosed that further comprises providing a semiconductor adjacent to the plurality of gate dielectrics, and providing both a source electrode and a drain electrode adjacent to a surface of the semiconductor opposite the plurality of gate structures. Another process for forming electronic devices comprises providing both a source electrode and a drain electrode adjacent to the plurality of gate dielectrics, and further providing a semiconductor adjacent to a surface of both the source electrode and the drain electrode opposite the plurality of gate structures.

In a first aspect, a process is provided for forming a plurality of gate structures. A web is provided that comprises a substrate, a plurality of conductive elements disposed on the substrate, and a conductive anodization bus. The conductive anodization bus is adjacent to a first edge of the substrate. A first conductive element and at least one second conductive element are electrically connected to the conductive anodization bus. The web is moving, such that the web is delivered with a web delivery roll and received with a web receiving roll. The web extends from the web delivery roll to the web receiving roll, and the web passes from the web delivery roll to the web receiving roll. The web passes through an anodization station. The anodization station comprises a anodization bath having an entry location and an exit location for the web; an electrochemical solution retained within the anodization bath, wherein the electrochemical solution has a surface; a cathode located within the electrochemical solution where the plurality of conductive elements is positioned between the substrate and the cathode; an anode; and a power supply attached to the anode and the cathode. The anode comprises the conductive anodization bus where at least a portion of the conductive anodization bus is positioned above the surface of the electrochemical solution; a plurality of conductive elements where at least a portion of the plurality of the conductive elements are positioned below the surface of the electrochemical solution; and a plurality of clamps, where at least one clamp is in electrical contact with the conductive anodization bus. At least a portion of the surface of the plurality of conductive elements exposed to the electrochemical solution is anodized to form a plurality of gate structures. The plurality of gate structures comprises a plurality of gate dielectrics adjacent to a plurality of gate electrodes. The plurality of gate electrodes is positioned between the plurality of gate dielectrics and the substrate.

In a second aspect, a process is provided for forming a plurality of electronic devices. A web is provided that comprises a substrate, a plurality of conductive elements disposed on the substrate, and a conductive anodization bus. The conductive anodization bus is adjacent to a first edge of the substrate. A first conductive element and at least one second conductive element are electrically connected to the conductive anodization bus. The web is moving, such that the web is delivered with a web delivery roll and received with a web receiving roll. The web extends from the web delivery roll to the web receiving roll, and the web passes from the web delivery roll to the web receiving roll. The web passes through an anodization station. The anodization station comprises an anodization bath having an entry location and an exit location for the web; an electrochemical solution retained within the anodization bath, wherein the electrochemical solution has a surface; a cathode located within the electrochemical solution where the plurality of conductive elements is positioned between the substrate and the cathode; an anode; and a power supply attached to the anode and the cathode. The anode comprises the conductive anodization bus where at least a portion of the conductive anodization bus is positioned above the surface of the electrochemical solution; a plurality of conductive elements where at least a portion of the plurality of the conductive elements are positioned below the surface of the electrochemical solution; and a plurality of clamps, where at least one clamp is in electrical contact with the conductive anodization bus. At least a portion of the surface of the plurality of conductive elements exposed to the electrochemical solution is anodized to form a plurality of gate structures. The plurality of gate structures comprises a plurality of gate dielectrics adjacent to a plurality of gate electrodes. The plurality of gate electrodes is positioned between the plurality of gate dielectrics and the substrate. The process further comprises providing a semiconductor adjacent to the plurality of gate dielectrics. A source electrode and a drain electrode are both provided adjacent to the surface of the semiconductor opposite the plurality of gate structures, such that the source electrode is not in contact with the drain electrode.

In a third aspect, a process is provided for forming a plurality of electronic devices. A web is provided that comprises a substrate, a plurality of conductive elements disposed on the substrate, and a conductive anodization bus. The conductive anodization bus is adjacent to a first edge of the substrate. A first conductive element and at least one second conductive element are electrically connected to the conductive anodization bus. The web is moving, such that the web is delivered with a web delivery roll and received with a web receiving roll. The web extends from the web delivery roll to the web receiving roll, and the web passes from the web delivery roll to the web receiving roll. The web passes through an anodization station. The anodization station comprises a anodization bath having an entry location and an exit location for the web; an electrochemical solution retained within the anodization bath, wherein the electrochemical solution has a surface; a cathode located within the electrochemical solution where the plurality of conductive elements is positioned between the substrate and the cathode; an anode; and a power supply attached to the anode and the cathode. The anode comprises the conductive anodization bus where at least a portion of the conductive anodization bus is positioned above the surface of the electrochemical solution; a plurality of conductive elements where at least a portion of the plurality of the conductive elements are positioned below the surface of the electrochemical solution; and a plurality of clamps, where at least one clamp is in electrical contact with the conductive anodization bus. At least a portion of the surface of the plurality of conductive elements exposed to the electrochemical solution is anodized to form a plurality of gate structures. The plurality of gate structures comprises a plurality of gate dielectrics adjacent to a plurality of gate electrodes. The plurality of gate electrodes is positioned between the plurality of gate dielectrics and the substrate. The process further comprises providing both a source electrode and a drain electrode adjacent to the plurality of gate dielectrics, such that the source electrode is not in contact with the drain electrode. A semiconductor is provided adjacent to the surface of both the source electrode and the drain electrode opposite the plurality of gate structures.

BRIEF DESCRIPTION OF THE DRAWINGS

FIG. 1 is a schematic representation of an exemplary web comprising a substrate, a plurality of conductive elements disposed on the substrate, and an anodization bus disposed on the substrate.

FIG. 2 is a schematic representation of a top view of an exemplary anodization station.

FIG. 2A is a schematic representation of an exemplary anode.

DETAILED DESCRIPTION

Figure 3:
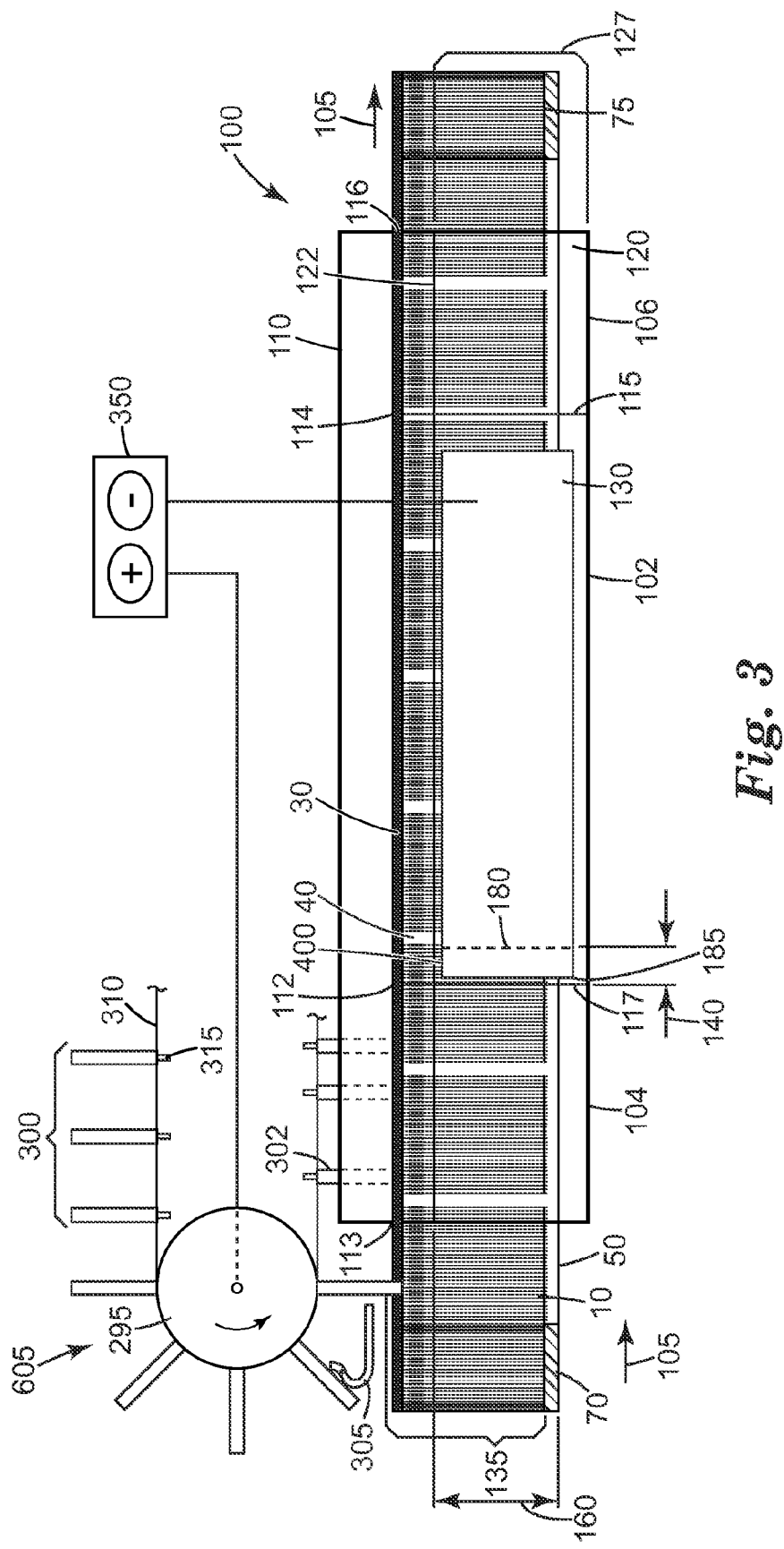
FIG. 3 is a schematic representation of a side view of an exemplary anodization station and an exemplary horizontal conveyor for moving a web.

For the following defined terms, these definitions shall be applied, unless a different definition is given in the claims or elsewhere in the specification.

The term "a plurality of" refers to at least two or more of an object, device, or compound. For example, a plurality of conductive elements refers to at least two or more conductive elements.

The term "conductive element" refers to a structure that is capable of transmitting or conducting electrical current. For example, the conductive element may be a metal disposed on a substrate prior to anodization.

The term "gate structure" refers to a gate dielectric adjacent to a gate electrode. The gate dielectric may be formed by anodizing the surface of a conductive element.

The term "gate electrode" refers to a conductive portion of a gate structure, and corresponds to the portion of the conductive element that is not oxidized during the anodization process.

The term "gate dielectric" refers to the nonconductive portion of a gate structure, and corresponds to the portion of the conductive element that is oxidized (for example, anodized) during the anodization process.

The term "web" refers to an article that includes a substrate, a plurality of conductive elements disposed on the substrate, and a conductive anodization bus disposed on the substrate. The web may be flexible, and may be moved from a web delivery roll to a web receiving roll.

The term "anodization station" refers to an anodization bath, an electrochemical solution within the anodization bath, a cathode, an anode, and a power supply. Some exemplary anodization baths comprise a first collection tank, a central tub, and a second collection tank. The anode comprises a conductive anodization bus, a plurality of conductive elements. The anodization station provides for a portion of the surface of the plurality of conductive elements to be anodized, and a plurality of clamps. The anodized conductive elements form a gate structure comprising a gate dielectric adjacent to a gate electrode.

The term "anodization current density" refers to the current per unit area flowing through the surface of an electrode during anodization in units of amperes/square centimeter ($A/cm^2$).

The term "electrochemical solution" refers to an aqueous solution comprising electrolytes or ionic compounds useful for inducing a chemical change of a material accompanying the passage of an electrical current in the presence of two electrodes. For example, the surface of a metal immersed in an electrochemical solution having an electrical current passing through it may be anodized or oxidized.

The term "conductive anodization bus" refers to a conductive material disposed on a substrate that may be positioned parallel to a first edge of a substrate. For example, the conductive anodization bus may be a narrow band or strip of conductive material for providing an electrical connection between the individual conductive elements of a plurality of conductive elements. The conductive anodization bus remains conductive during the anodization process, and at least a portion of the conductive anodization bus may be kept out of the electrochemical solution. The conductive anodization bus often provides a location for at least one clamp.

The recitation of numerical ranges by endpoints includes all numbers subsumed within that range (for example, 1 to 5 includes 1, 1.5, 2, 2.75, 3, 3.8, 4, and 5).

As included in this specification and the appended claims, the singular forms "a", "an", and "the" include plural referents unless the content clearly dictates otherwise. Thus, for example, reference to a composition containing "a compound" includes a mixture of two or more compounds. As used in this specification and appended claims, the term "or" is generally employed in its sense including "and/or" unless the content clearly dictates otherwise.

Unless otherwise indicated, all numbers expressing quantities or ingredients, measurement of properties and so forth used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings of the present disclosure. Notwithstanding that the numerical ranges and parameters setting forth the broad scope of the disclosure are approximations, the numerical values set forth in the specific examples are reported as precisely as possible. Any numerical value, however, inherently contains errors necessarily resulting from the standard deviations found in their respective testing measurements.

The present disclosure describes a process for forming a plurality of gate structures. A web is provided that has a substrate, a plurality of conductive elements disposed on the substrate, and a conductive anodization bus that is disposed on the substrate. The conductive anodization bus is adjacent to a first edge of the substrate. A first conductive element and at least one second conductive element are electrically connected to the conductive anodization bus. The web passes from a web delivery roll to a web receiving roll, and moves through an anodization station to anodize at least a portion of the surface of the plurality of conductive elements. The anodization station includes an anodization bath, an electrochemical solution within the anodization bath, a cathode, an anode, and a power supply. The anodization bath has an entry location and an exit location for the web. The cathode is located below a surface of the electrochemical solution. The anode comprises the conductive anodization bus, the plurality of conductive elements, and a plurality of clamps. The power supply is connected to the anode and the cathode. At least a portion of the surface of the plurality of conductive elements are exposed to the electrochemical solution and anodized as the web passes through the anodization station to form a plurality of gate structures. The plurality of gate structures comprises a plurality of gate dielectrics adjacent to a plurality of gate electrodes.

An exemplary web 50 as illustrated in FIG. 1 comprises a substrate 40, a plurality of conductive elements 10 disposed on the substrate 40, and a conductive anodization bus 30 disposed on the substrate 40. The substrate 40 may provide support for the plurality of conductive elements 10 and for the anodization bus 30. The conductive elements 10 may be arranged in rows on the substrate 40. Although the conductive elements 10 in FIG. 1 are shown as a series of parallel lines, the conductive elements can be patterned in any suitable manner. Further, the substrate 40 can be electrically insulating to prevent shorting during anodization of the plurality of conductive elements 10. The conductive anodization bus 30 can be parallel to a first edge 5 of the substrate 40. The plurality of conductive elements 10 are electrically connected to the conductive anodization bus 30. For example, a first conductive element 15, and at least a second conductive element 20 are electrically connected to the conductive anodization bus 30.

A substrate 40 of web 50 may be used to support a deposited or attached material during manufacturing, testing, storage, use, or any combination thereof. The substrate 40 may be permanent, semi-permanent, or removable from the elements or structures that it supports. The substrate 40 may be flexible. For example, the substrate 40 may comprise polymeric materials, filled polymeric materials, acrylics, epoxies, polyamides, polycarbonates, polyimides, polyetherimides, polyketones, liquid crystal polymers, poly(oxy-1,4-phenyleneoxy-1,4-phenylenecarbonyl-1,4-phenylene) (PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP). In some embodiments, a substrate 40, which is flexible, may comprise poly(ethylene terephthalate) (PET), poly(ethylene naphthalenedicarboxylate) (PEN), poly(ether ether ketone), or combinations thereof.

Generally, a plurality of conductive elements 10 and a conductive anodization bus 30 may be components of a web 50 formed by depositing and patterning an electrically conductive layer, such as a metal layer, on a substrate 40 or substrate material. An adhesion layer may be applied to the substrate 40 prior to the deposition of the conductive layer. The adhesion layer may comprise an inorganic oxide, for example, $SiO_x$. The conductive layer may be deposited using any suitable known method such as thermal evaporation, e-beam evaporation, sputtering, flame hydrolysis, casting, plasma deposition or any other deposition method that may be desirable in an application. The conductive layer on the substrate 40 may be patterned by a series of steps.

A plurality of conductive elements 10 and a conductive anodization bus 30 can be formed from a patterned conductive layer. Some of the processing steps used to form the patterned conductive layer may include laminating or coating a photoresist layer (not shown) onto an electrically conductive layer of FIG. 1. After application of the photoresist layer, the conductive layer may be masked with an aperture mask, and subsequently exposed to a radiation source. For example, the material exposed to radiation is typically cured while the masked material is not typically cured. The uncured material can be removed. The photoresist layer may be developed (for example, selectively removed), followed by etching of the conductive layer with a caustic or acidic solution. The photoresist layer may be stripped from the conductive layer and the substrate 40. The web 50 may be rinsed and cleaned in a series of steps to provide the patterned conductive elements (for example, plurality of conductive elements 10) and the conductive anodization bus 30 disposed on the substrate 40.

A plurality of conductive elements 10 may be any material that is capable of being at least partially anodized upon exposure to an electrochemical solution to form a gate structure comprising a gate dielectric adjacent to a gate electrode. In general, the conductive elements 10 and the conductive anodization bus 30 of FIG. 1 can be any anodizable metal, an alloy of any anodizable metal, a combination of anodizable metals, multilayers of anodizable metals, or combinations thereof. In some embodiments, the plurality of conductive element 10 and the conductive anodization bus 30 may be aluminum, tantalum, niobium, titanium, tungsten, zirconium, hafnium, or combinations thereof. In one embodiment, the plurality of conductive elements 10 and the conductive anodization bus 30 are composed of the same conductive material.

A plurality of conductive elements 10 can be disposed parallel to one another on a substrate 40, where the substrate 40 is flexible, as illustrated in FIG. 1 for providing a web 50. A first conductive element 15 may be parallel to a second conductive element 20. The first conductive element 15 and at least one second conductive element 20 are electrically connected to the conductive anodization bus 30 providing an electrically conductive path between the conductive elements 10. The plurality of conductive elements 10 optionally further comprises row contact pads 72 located below the conductive anodization bus 30 of the vertically oriented web 50. During anodization of the plurality of conductive elements 10, an optional anodization mask, for example, a photoresist 80, may be applied to the web 50 to protect the row contact pads 72 and a portion of the conductive elements 10. That is, the row contact pads 72, which are used to provide contact to the resulting electronic devices, remain conductive during the anodization process by being protected with the optional photoresist 80. Plating tape is another example of an anodization mask that can be used to protect a conductive material from anodization. A bus disconnection line 90, extending orthogonal to the row contact pads 72 and the conductive anodization bus 30, may be used to separate the conductive anodization bus 30 from the web 50 after manufacture of gate structures. The bus disconnection line 90 may be removed by cutting, etching, laser techniques, or combinations thereof. The at least one second conductive element 20 can be electrically connected to a third conductive element 25 through contact with the conductive anodization bus.

Other configurations of the plurality of conductive elements 10 on a substrate 30 may be envisioned. For example, although FIG. 1 illustrates the plurality of conductive elements 10 patterned as parallel lines, the conductive elements 10 can have any shape and can be arranged in other configurations.

FIG. 1 further illustrates a web 50, having a generally vertical orientation, in which a portion of the surface of the plurality of conductive elements 10 on a substrate 40 may not be anodized. In one embodiment, the row contact pads 72 and the conductive anodization bus 30 may be above a surface of an electrochemical solution 120 present in an anodization bath 110 of an anodization station 100 illustrated in FIG. 2. In another embodiment, an optional photoresist 80 or plating tape may be used to prevent anodization of a portion of a surface of the plurality of conductive elements 10 above and below the surface of the electrochemical solution 120 in the anodization bath 110. For example, the optional photoresist 80 or plating tape can be placed over the row contact pads 72 during anodization.

Referring to FIG. 2, a web 50 may begin on a roll as it is delivered with a web delivery roll 70, and received with a web receiving roll 75. The web 50 can be pulled from the web delivery roll 70 extending to the web receiving roll 75. The web 50 passes from the web delivery roll 70 to the web receiving roll 75. The moving web 50 may provide economy of scale and manufacturing over flat and/or rigid substrates. The web 50 can be moved continuously or can be alternatively moved and held in a stationary position. The web 50 chosen may be capable of unwinding from web delivery roll 70, and wrapping around the circumference of a web receiving roll 75, where the web delivery roll 70 and the web receiving roll 75 independently can have a diameter (for example, inner diameter) of up to 50 cm, up to 25 cm, up to 10 cm, up to 5 cm, up to 3 cm, up to 2 cm, or up to 1 cm without distorting or breaking. The force used to wrap the web (for example, a flexible web) 50 around the web receiving roll 75 may be low, such as by unassisted hand, for example, without the aid of levers, machines, hydraulics, and the like. The web 50 may be rolled upon itself. In one embodiment, the web 50 may be sufficiently flexible to be treated in a roll-to-roll process having at least one web delivery roll 70 and at least one web receiving roll 75.

FIG. 2 illustrates an exemplary top view of a web 50 passing through an exemplary anodization station 100 for anodizing at least a portion of the plurality of conductive elements 10 on a substrate 40 exposed to an electrochemical solution 120 in the anodization bath 110. The web 50 moves horizontally from the web delivery roll 70 to the web receiving roll 75 having a vertical orientation in a web direction 105. Web 50 enters the anodization bath 110 at an entry location 113 and exits at an exit location 116 on an opposite side of the anodization bath 110.

FIG. 2 and FIG. 3 illustrate an exemplary anodization bath 110 comprising a central tub 102, a first collection tank 104, and a second collection tank 106. The central tub 102 comprises an entrance wall 112 having an entrance slot 117 opening into the first collection tank 104, and an egress wall 114 comprising an egress slot 115 opening into the second collection tank 106. The first collection tank 104 comprises an entry location 113. The second collection tank 106 comprises an exit location 116. A web 50 passes through the anodization bath 110 of an anodization station 100. Pumps (not shown) can be located on the bottom of central tub 102, the first collection tank 104, and the second collection tank 106 for pumping an electrochemical solution 120 sufficient to maintain a depth 127 in central tub 102 as illustrated in FIG. 3. The central tub 102 comprises the electrochemical solution 120 for anodization of a plurality of conductive elements 10. The electrochemical solution 120 flows out through the entrance slot 117 and the egress slot 115 of the central tub 102. The electrochemical solution 120 flowing from the entrance slot 117 and the egress slot 115 can be collected in the first collection tank 104 and the second collection tank 106, respectively, and pumped back into the central tub 102 as further described in U.S. Pat. No. 3,643,670 (Sabatka et al.).

A cathode 130 may have a first edge 185 and a first location 180. The first location 180 may be located at a first distance 140 from the entrance wall 112 of the central tub 102 of the anodization bath 110. An optional baffle 400 may be located adjacent to the cathode 130. The optional baffle 400 may be located between the cathode 130 and the plurality of conductive elements 10 on the substrate 40. The optional baffle 400 may extend from a first edge 185 to a first location 180. The plurality of conductive elements 10 can be located between the substrate 40 and the cathode 130. A web 50 may be located at a fourth distance 210 from the cathode 130 to the plurality of conductive elements 10 on the substrate 40. The plurality of conductive elements 10 may be located at a second distance 145 from a first side 165 of the central tub 102. The first side 165 may be parallel to the cathode 130 submerged within the central tub 102. A voltage can be provided with a power supply 350 attached to both the cathode 130 and an anode 135 that is at least partially within the electrochemical solution 120 to produce an electrical current. FIG. 2A illustrates an exemplary anode 135 comprising a conductive anodization bus 30 disposed on a substrate 40, a plurality of conductive elements 10, and an anode clamp 302 in contact with the conductive anodization bus 30.

FIG. 3 illustrates a side view of an exemplary anodization station 100. Anodization station 100 comprises an anodization bath 110, an electrochemical solution 120 within the anodization bath 110, a cathode 130, an anode 135, and a power supply 350. The anodization bath 110 comprises a first collection tank 104 having an entry location 113, a central tub 102, and a second collection tank 106 having an exit location 116 for a web 50 to pass through in a web direction 105. The central tub 102 of the anodization bath 110 has sufficient volume to retain the electrochemical solution 120. The central tub 102 further has a depth 127 sufficient to anodize at least a portion of conductive elements 10 on the substrate 40 of the moving web 50. In this embodiment, the web 50 is oriented vertically as it passes through the anodization bath 110 in a horizontal direction 105. The anodization bath 110 comprises an electrochemical solution 120, wherein at least a portion of the plurality of conductive elements 10 can be exposed to the electrochemical solution 120 in a region extending from the entrance wall 112 to the egress wall 114 of the central tub. The cathode 130 is located within the electrochemical solution 120 of the central tub 102 of the anodization bath 110. In one embodiment, a portion of the cathode 130 may extend above the surface 122 of the electrochemical solution within the central tub 102. The cathode 130 can be located at a first distance 140 extending from the entrance wall 112 to a first location 180 of the cathode 130. The first distance 140 may be sufficient to prevent arcing at the entrance wall 112 by providing a sufficiently low electrical potential in the electrochemical solution 120 at the entrance wall 112. A third distance 160 determines the cross-web width of the web 50 comprising a plurality of conductive elements 10 below the surface 122 of the electrochemical solution 120 in the central tub 102.

An electrochemical solution 120 can be used to anodize at least a portion of the surface of a plurality of conductive elements 10 of a web 50 exposed to the electrochemical solution 120. The electrochemical solution 120 may be commonly referred to as an electrolyte solution. The electrochemical solution 120 may exist as an aqueous solution of acids, bases, salts, or mixtures thereof. Ions or electrolytes of the electrochemical solution 120 conduct electricity in the aqueous solution. An electrical current within the electrochemical solution 120 may result when the individual components of an acid, base or salt dissociate as electrolytes due to the thermodynamic interaction between the solvent (for example, water, alcohols, and combinations thereof) and the solute molecules with the application of a voltage supplied by power supply 350. Gases may also act as electrolytes under conditions of high temperature or low pressure. In one embodiment, an electrochemical solution 120 may comprise a carboxylic acid, a salt of a carboxylic acid, or mixtures thereof. For example, the electrochemical solution 120 may comprise tartaric acid, a salt of tartaric acid, or a mixture thereof.

A cathode 130 can have different configurations such as a plate, a rod, a mesh, a screen, or combinations thereof. The material selected for the cathode 130 may be essentially any electronic conductor that is essentially unreactive (for example, inert) in the electrochemical solution 120 contained within the central tub 102 of the anodization bath 110. The cathode 130 may be attached to a power supply 350 for providing a voltage to an electrochemical solution 120. Some examples of materials for the cathode 130 may comprise carbon, lead, nickel, stainless steel, platinum, titanium, or combinations thereof. In some embodiments, the cathode 130 comprises stainless steel, platinum, titanium, or combinations thereof.

In one embodiment, a cathode 130 may further comprise an baffle 400 extending from a first edge 185 to a first location 180 of the cathode 130. The first edge 185 of the cathode is near the entrance wall 112 of the central tub 102. The baffle 400 may redirect voltage from the cathode 130 to the anode 135 at the entrance wall 112. The baffle 400 may comprise a nonconductive material. In one embodiment, the baffle 400 comprises polypropylene.

An optional baffle 400 may be submerged within the electrochemical solution 120 of the central tub 102, or a portion of the optional baffle 400 may be above the surface 122 of the electrochemical solution 120. In one embodiment, a portion of the optional baffle 400 and a portion of the cathode 130 may be at a distance above the surface 122 of the electrochemical solution 120 within the central tub 102.

A cathode 130 illustrated in FIG. 2 and FIG. 3 may be located at a first distance 140 from the entrance wall 112 of the central tub 102 to a first location 180 of the cathode 130. The first distance 140 may be sufficient to prevent arcing at the entrance wall 112 of a central tub 102 by providing a sufficiently low electrical potential in the electrochemical solution 120 at the entrance location 112. Shorting or arcing of electrical current may cause damage to the web and electrodes on the web, may pose harm to humans, and may cause potential damage to equipment and surrounding areas. It is desirable to have an anodization process which provides a low voltage where the web 50 enters at an entrance slot 117, and exits at an egress slot 115 of a central tub 102. Also, the resistivity of the electrochemical solution 120 may be considered in order to limit the local anodization current density, while simultaneously applying a maximum voltage in a region proximate to where the web 50 exits an electrochemical solution 120. By taking advantage of the resistivity of the electrochemical solution 120, the appropriate design of the anodization bath 110, the cathode 130 shape and placement, the areal density of the metal or a plurality of conductive elements 10, and the speed of the web 50 moving through the anodization bath 110, a suitable profile of current density and voltage can be developed.

Several parameters for a web 50 may be considered for the placement of a cathode 130 at a first distance 140 from the entrance location 112 of a central tub 102 to reduce possible arcing of the electrical current within the anodization station 100. Generally, the thickness of the anodic oxide formed during anodization (that is, the thickness of the gate dielectric formed during anodization) is approximately proportional to the applied anodization voltage. The amount of charge required to grow this oxide can be described by an equivalent capacitance, C, where C=the amount of charge per volt per unit area (mF/cm$^2$) needed to reach a given anodization voltage. In one embodiment, the equivalent capacitance for aluminum (Al) is approximately 2 mF/cm$^2$.

The anodization current, $I_A$ (A), can be defined by Formula I, where $$I_A = AWSVC. \tag{I}$$

Some of the other parameters of Formula I include:

A=fraction of the area of the web 50 surface (for example, submerged in the electrochemical solution 120) that comprises a plurality of conductive elements 10 or a metal to be anodized, W=width (cm) 160 of the web 50 submerged in the electrochemical solution 120, S=web 50 speed (cm/s), and V=anodization voltage (volts) for a power supply 350.

The anodization current density, that is, the current per unit area, running into the oxide (for example, gate dielectric) formed on the surface of the plurality of conductive elements 10 at a given point, increases approximately exponentially as the first distance 140 from the first location 180 of the cathode 130 becomes smaller. The length scale (cm) of this exponential behavior can be approximated by Formula II:

$$\lambda = D/ASRC. \qquad (II)$$

The parameters of Formula II include:

R=resistivity (ohm-cm) of the electrolyte of the electrochemical solution 120, and D=distance (cm) 145 (as shown in FIG. 2) from a first side 165 of the central tub 102 of an anodization bath 110, the first side 165 extending parallel to the surface of the web 50 submerged within the central tub 102 to the plurality of conductive elements 10 on a substrate 40 of the web 50. Generally, D represents the thickness of the conducting volume of the electrochemical solution 120 in a direction normal to the surface of the web 50.

If a first distance 140 between the entrance slot 117 of the central tub 102 and the cathode 130 is sufficient, the potential of the electrochemical solution 120 at the entrance slot 117 will be small enough to prevent arcing or a region of unacceptably high anodization current density at the entrance slot 117. In general, the first distance 140 should be greater than $\lambda$ (length scale (cm)), greater than $2\lambda$, or greater than $3\lambda$.

More generally, the shortest path through the electrochemical solution 120 between the cathode 130 and the entrance slot 117 of the central tub 102 should be greater than $\lambda$ (cm), greater than $2\lambda$, or greater than $3\lambda$. The path can be lengthened by increasing the first distance 140 or including non-conductive baffles, for example, an optional baffle located between the first location 180 of cathode 130 and the entrance wall 112 of a central tub 102.

The rate of growth or thickening of the oxide layer (for example, gate dielectric) may be proportional to the anodization current density. The electrical field within the oxide layer may not change with the oxide thickness, and may have only a small dependence on current density and temperature. In one embodiment, as the oxide layer grows, the voltage across the oxide layer increases proportionally. In one embodiment, the thickness of the oxide layer/voltage ratio at room temperature may be in a range of 1.2 to 1.5 nanometers per volt (nm/volt). The oxide layer thickness can be generally uniform across the surface of a plurality of conductive elements 10, since the applied voltage drop can be essentially uniform in a region of low anodization current density near the egress slot 115 of central tub 102.

FIG. 3 further illustrates an anodization station 100 having an anodization bath 110 which may be used in a roll-to-roll process for passing through a web 50. A horizontal conveyer 605 located above the anodization station 100 can support and help move the web 50 through the anodization station 100. The anodization station 100 can be designed for anodizing a horizontally moving, vertically positioned web 50.

Figure 4:
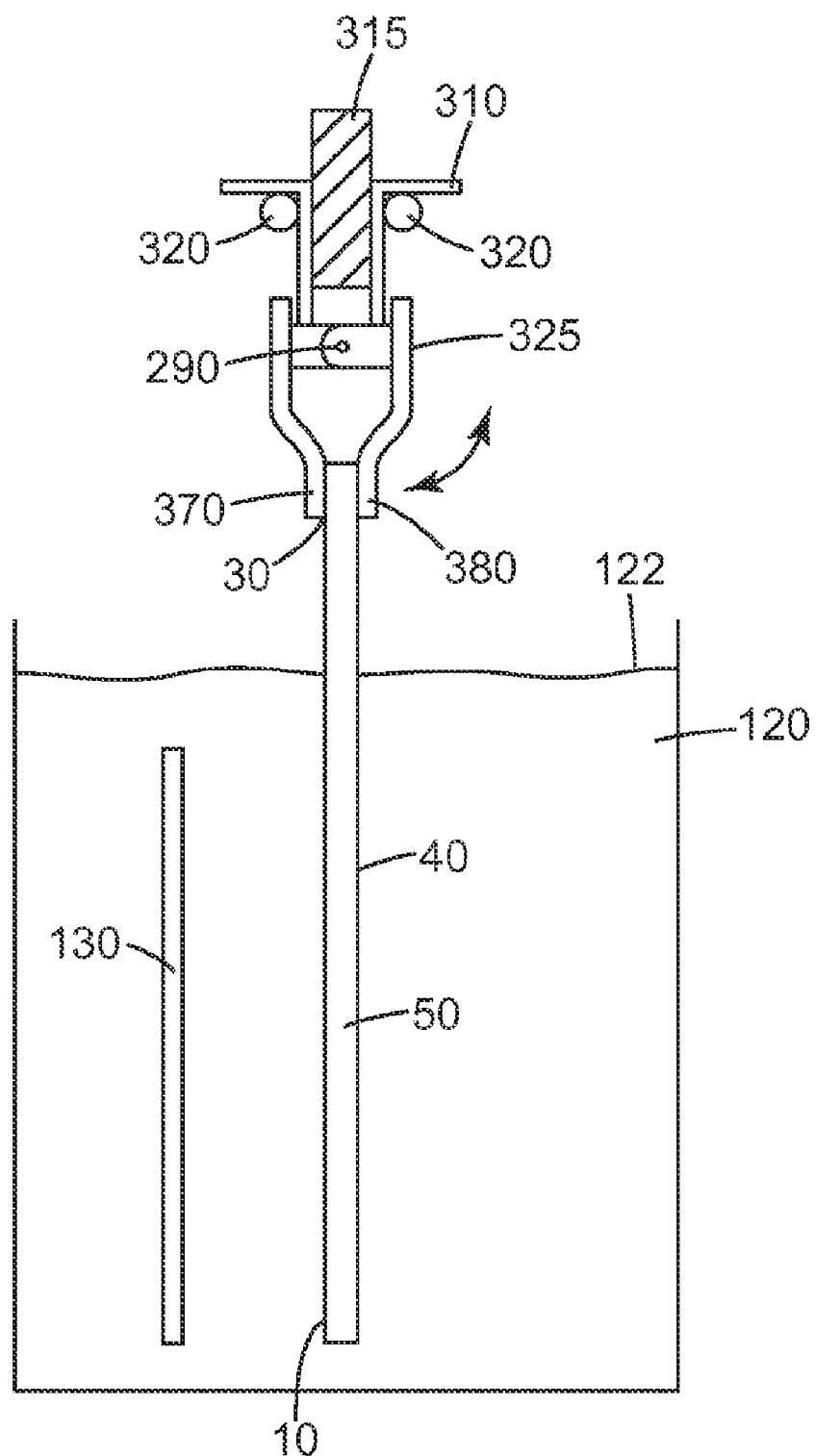
FIG. 4 is a schematic representation of an end view of an exemplary horizontal conveyor for moving a web through an anodization station.

The anodization bath 110 comprises an entry location 113 at the first collection tank 104, and an exit location 116 at the second collection tank 106, which can be vertical slots or openings at opposite ends of the anodization bath 110. The web 50 can be fed into a first collection tank 104 and passed through an entrance slot 117 of a central tub 102 comprising the electrochemical solution 120. The web 50 may be passed through the central tub 102 and moved through the egress slot 115 of the central tub 102 into a second collection tank 106. A plurality of clamps 300 contacts the web 50 being vertically positioned and horizontally unwound at web delivery roll 70 and taken up at web receiving roll 75. The anode clamps 300 open and close with a clam cam 305. As the anode clamps 300 approach a pulley 295 above the web delivery roll 70 on a horizontal metal belt 310, the anode clamps 300 contact the clam cam 305. The clamp cam 305 opens the anode clamps 300 separating the second contact 380 from the first contact 370 as illustrated in FIG. 4. The first contact 370 makes contact with the anodization bus 30, and the second contact 380 contacts the substrate 40 when the anode clamps 300 attach to the web 50 near the web delivery roll 70 prior to entering the anodization bath 100 at the entry location 113 of the first collection tank 104. In some embodiments, the first contact 370 and the second contact 380 may both contact an anodization bus 30 located on both sides of a web 50, such that the web 50 comprises a plurality of conductive elements 10 on both sides of the web 50. The anode clamps 300 make contact with the conductive anodization bus 30 to complete the electrical circuit for the movement of electrical current sufficient for anodizing at least a portion of the surface of the plurality of conductive elements 10. The plurality of conductive elements 10 may be exposed at a third distance 160 within the electrochemical solution 120 having a surface 122 and a depth 127 as illustrated in FIG. 3 and FIG. 4. A portion of the surface of the plurality of conductive elements 10 may not be submerged in the electrochemical solution 120 within the anodization bath 110. After moving the web 50 through the central tub 102, the anode clamps 300 release the web 50 upon exiting the anodization bath 110 at the exit location 116 of the second collection tank 106. After the web 50 leaves the second collection tank 106, the web 50 may optionally be passed through a rinse station, an air knife, a drying station, or combinations thereof, prior to being passed to the web receiving roll 75. Before a first clamp of the anode clamps 300 is released from the web 50, a second clamp is engaged, so that at any time, at least one clamp of the anode clamps 300 is attached to the conductive anodization bus 30.

An exemplary horizontal conveyer 605 of FIG. 3 comprises a pulley 295 having a clamp cam 305 for opening and closing the anode clamps 300. This system is further described in U.S. Pat. No. 3,643,670 (Sabatka et al.). The pulley 295 moves the anode clamps 300 along a horizontal conductive metal belt 310. The horizontal metal belt 310 rests upon glide rolls 320 illustrated in FIG. 4. The anode clamps 300 comprise a lifter 315, a spreader 290, a spring mechanism 325, a first contact 370, and a second contact 380 for attaching and releasing a vertically oriented web 50. The first contact 370 contacts the anodization bus 30, and the second contact 380 contacts the substrate 40 of web 50. The first contact 370 may be rigid, and the second contact 380 may be capable of being moved or displaced during movement of the anode clamps 300 over clamp cam 305. The pulley 295 maintains contact with the anode clamps 300 connected to the horizontal metal belt 310.

As the web 50 moves through the anodization bath 110, a plurality of conductive elements 10 can be anodized. As the web 50 exits the anodization bath 110 at the exit location 116, the anode clamps 300 release the web 50 to be received with the web receiving roll 75. With the attachment of at least one clamp of a plurality of anode clamps 300 being attached to the web 50 at a conductive anodization bus 30, a maximum dispersion of electrical current can be obtained throughout the moving web 50, where the current density throughout any one anode clamp 300 may be minimized. In one embodiment, the moving web 50 may have a plurality of conductive elements 10 disposed on a substrate 40, where the plurality of conductive elements 10 may be optionally patterned.

A voltage can be applied using a power supply 350 connected to a cathode 130 and an anode 135 to complete an electrical circuit as illustrated in FIG. 2 and FIG. 3. Upon application of voltage to the electrical circuit, the electrolytes of the electrochemical solution 120 produce an electrical current. A negative charge provided by the power supply 350 enters through the cathode 130. Typically, a first chemical reaction occurs at the cathode 130 immersed within the electrochemical solution 120. The electrochemical solution 120 consumes electrons from the cathode 130, and a second chemical reaction occurs at the anode 135 comprising a portion of the surface of the plurality of conductive elements 10 being exposed to the electrochemical solution 120 producing electrons which can be taken up by the anode 135. A negative charge cloud develops in the electrochemical solution 120 around the cathode 130, and a positive charge cloud develops around the anode 135. The ions of the electrolyte within the electrochemical solution 120 move to neutralize these charges so that the reactions can continue, and the electrons flow. The electrical current generated can result in the oxidation or anodization of the surface of the plurality of conductive elements 10. A portion of the surface of the plurality of conductive elements 10 can be located outside or above the level of the electrochemical solution 120, while a portion of the surface of the plurality of conductive elements 10 may be submerged within the anodization bath 110. Electrochemical solution 120 may be circulated and replenished using recirculation pumps as needed to maintain an appropriate concentration of the electrolytic species.

Figure 5:
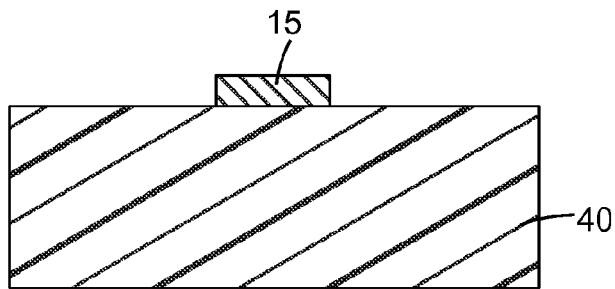
FIG. 5 is a schematic cross-sectional representation of an exemplary web comprising a substrate with a conductive element.

FIG. 5 illustrates a cross-sectional view of a first conductive element 15 on a substrate 40 prior to anodization. The first conductive element 15 may be illustrative of one of a plurality of conductive elements 10 on a substrate 40 of an exemplary web 50. The first conductive element 15 as patterned may be oriented parallel to a second conductive element 20, which may be oriented parallel to a third conductive element 25 as illustrated in FIG. 1. Anodization of the conductive element 15 of FIG. 5 results in the formation of a gate structure 85 as shown in FIG. 6.

Figure 6:
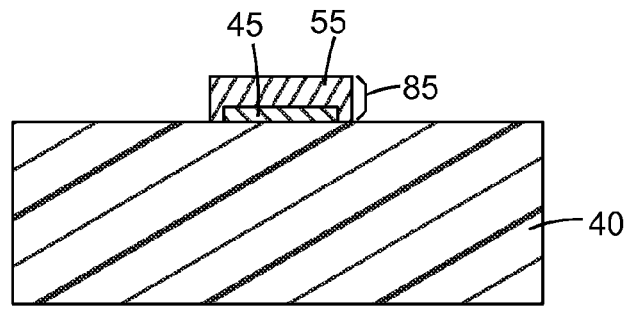
FIG. 6 is a schematic cross-sectional representation of an exemplary gate structure on a web with the gate structure comprising a gate dielectric adjacent to a gate electrode.

A gate dielectric 55 may be provided adjacent to a gate electrode 45 as illustrated in FIG. 6 by a solution anodization process. The gate dielectric 55 may result from anodization of a conductive element 15, where the conductive element 15 is an inorganic material or an anodizable material. The gate dielectric 55 electrically insulates the gate electrode 45 under the operating conditions of an electronic device from the balance of the device. The gate dielectric 55 can have a dielectric constant of at least 2, at least 5, at least 10, at least 25, or at least 40. The dielectric constant of the gate dielectric 55 may be up to 150, up to 125, up to 100, or up to 75. The dielectric constant may be in a range of 2 to 150, in a range of 5 to 125, or in a range of 10 to 100.

The first conductive element 15 being deposited and patterned on a substrate 40 of FIG. 5 can be passed through an anodization station 100 to form an exemplary gate structure 85 of FIG. 6. A plurality of conductive elements 10, such as oxidizable metals may be passed through the anodization station 100 to form a plurality of gate structures 85.

FIG. 6 illustrates a gate structure 85 comprising a gate dielectric 55 formed adjacent to a gate electrode 45 on a substrate 40. The gate electrode 45 can be positioned between the gate dielectric 55 and the substrate 40. The gate dielectric 55 of FIG. 6 may be a pin-hole free, low leakage, smooth surface which is sufficient as an insulator for an electronic device. The gate dielectric 55 may be achieved by anodization to produce a conformal coating.

At least a portion of the surface of the plurality of conductive elements 10 may be immersed in an electrochemical solution 120 during an anodization process for a period of time sufficient for circulation and agitation of the electrochemical solution 120. During the immersion of the web 50 within the anodization bath 110, the anodization solution 120 may reach and wet the surface of the plurality of conductive elements 10 even in areas where the conductive element 15 may be covered by, for example, a small particle. Such penetration by the electrochemical solution 120 may result in a substantially uniform anodization or oxidation of the plurality of conductive elements 10 even in areas where the surface of the conductive element 15 may be covered by a small foreign object such as a small particle.

Consequently, subsequent removal of a particle from the surface of the conductive element 15 may not result in a pinhole in the anodized layer or gate dielectric 55 exposing the conductive element 15. As a result, an advantage of using a liquid anodization process for oxidizing a conductive element 15 may result in a gate dielectric 55, where the gate dielectric 55 conforms to the surface profile of the conductive element 15 being anodized even if in some locations the surface is covered with, for example, small particles forming a conformal coating. In contrast, if the gate dielectric 55 is replaced with a gate dielectric layer that is formed by, for example, vapor depositing a dielectric material onto the conductive element 15, an area of the conductive element 15 covered by a small particle may not be coated during the deposition process, resulting in the conductive element 15 being exposed in the area after the particle is removed, for example, during further processing.

Another advantage of using an anodization process to form a gate dielectric 55 may be that anodization can result in a substantially uniform insulation of the gate electrode 45 as illustrated in FIG. 6. For example, during the anodization process more electrical current tends to flow through an area that is not as anodized, and therefore not as insulating, as the neighboring regions. The additional current intensifies the anodization of the area until the entire anodized region becomes uniformly insulating.

In contrast, in a batch anodization process, a low current density can be achieved by using a power supply operating in a "current source" mode. In this mode, the voltage applied between the cathode and the metal to be anodized may be controlled to provide a desired anodization current density. Initially this voltage may be small, but as the oxide grows, the required voltage gradually increases, until the power supply reaches a desired maximum (or compliance) voltage. Typically, the applied voltage is then held at this value until the anodization current falls to a sufficiently small value.

In another aspect, a process is described for forming a plurality of electronic devices further including both source electrodes and drain electrodes adjacent to a plurality of gate dielectrics. The process includes a semiconductor adjacent to surfaces of both the source electrode and the drain electrode.

Figure 7:
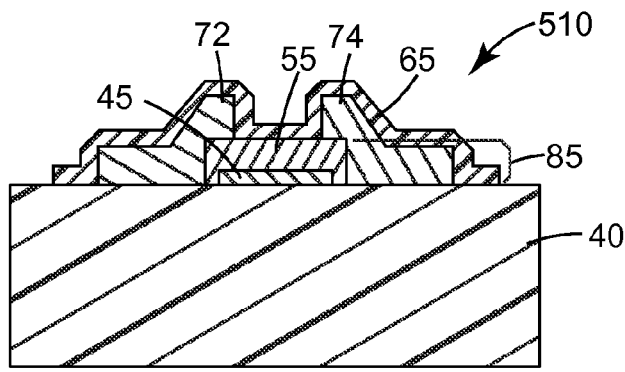
FIG. 7 is a schematic cross-sectional representation of FIG. 6 further comprising a source electrode and a drain electrode adjacent to a gate dielectric, and a semiconductor adjacent to the surface of both the source electrode and the drain electrode of an electronic device.

FIG. 7 illustrates a cross-section of an embodiment of an exemplary electronic device 510. A gate electrode 45 is provided on a substrate 40. A gate structure 85 can result from anodization of a conductive element 15 (FIG. 5) to form a gate dielectric 55 adjacent to a gate electrode 45. A source electrode 72 and a drain electrode 74 are both provided adjacent to a gate dielectric 55. The source electrode 72 and the drain electrode 74 are both opposite the gate structure 85. A semiconductor 65 is provided adjacent to a surface of both the source electrode 72 and the drain electrode 74.

In yet another aspect, a process is described for forming a plurality of electronic devices further including a semiconductor adjacent to a plurality of gate dielectrics. The process provides both a source electrode and a drain electrode adjacent to a surface of the semiconductor opposite the plurality of gate structures. The source electrode is not in contact with the drain electrode.

Figure 8:
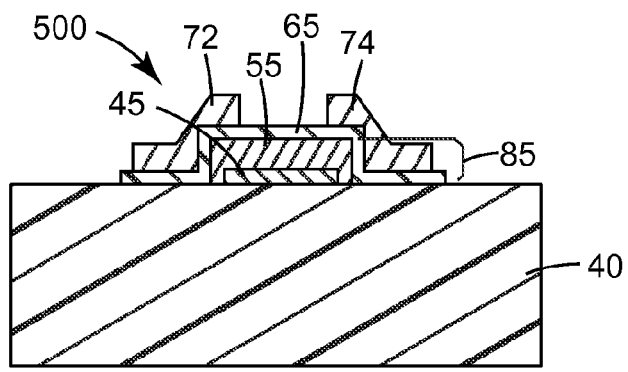
FIG. 8 is a schematic cross-sectional representation of FIG. 6 further comprising a semiconductor adjacent to a gate dielectric, and a source electrode and a drain electrode adjacent to the surface of the semiconductor of an electronic device.

FIG. 8 illustrates a cross-section of an exemplary electronic device 500, for example, a thin film transistor (TFT). A gate electrode 45 is provided on a substrate 40. A gate structure 85 can result from anodization of a conductive element 15 (FIG. 5) to form a gate dielectric 55 adjacent to a gate electrode 45. A semiconductor 65 can be provided adjacent to a gate dielectric 55. A source electrode 72 and drain electrode 74 may be provided adjacent to a surface of the semiconductor 65 opposite the gate structure 85. The source electrode 72 does not contact the drain electrode 74.

FIG. 7 and FIG. 8 illustrate examples of a gate structure 85 in an electronic device. The gate structure 85 can be extended to a plurality of gate structures 85 which comprise a plurality of gate dielectrics 55 adjacent to a plurality of gate electrodes 45. The gate structures 85 may be formed from a plurality of conductive elements 10 on a substrate 40. FIG. 7 and FIG. 8 independently represent a plurality of electronic devices 510 and 500, respectively.

In an electronic device, a voltage can be applied between the gate electrode/source (body) controlling the current flowing between the source and drain electrodes. Common electronic devices include transistors, for example, field effect transistors, arrays of transistors, capacitors, embedded capacitors, diodes, light emitting devices, stacked electronic devices and resistors that are used to form circuits. Electronic devices may include arrays of circuits that perform an electronic function. Examples of arrays or integrated circuits include amplifiers, receivers, transmitters, inverters and oscillators. Applications of these devices and arrays include radio frequency identification devices (RFIDs), smart cards, lamps, displays, and the like. Connections may be made between two or more devices adjacent to each other on the web to form an electrical circuit. In one embodiment, the electronic device is a thin film transistor. In another embodiment, the electronic device is an active matrix display backplane.

A semiconductor (for example, semiconductor layer) is a material whose electrical conductivity can be controlled over a wide range, either permanently or dynamically. The semiconductor layer may comprise inorganic semiconductor materials. Useful inorganic semiconductor materials include amorphous silicon, cadmium sulfide, cadmium selenide, tellurium, zinc oxide, blends, alloys and combinations thereof. Examples of semiconductors may further comprise germanium, gallium arsenide, indium phosphide, silicon germanium, aluminum gallium arsenide, or combinations thereof. In one embodiment, the semiconductor layer may be comprised of zinc oxide, indium zinc oxide, zinc tin oxide, indium gallium zinc oxide, or combinations thereof.

A semiconductor may be provided adjacent to a plurality of gate dielectrics of a plurality of electronic devices as shown in FIG. 8. In one embodiment, the semiconductor may be patterned adjacent to the plurality of gate dielectrics. In another embodiment, the semiconductor may be patterned adjacent to a source electrode and a drain electrode as shown in FIG. 7. Useful means for application of the semiconductor comprise vapor deposition, solution deposition, spin coating, printing techniques, and combinations thereof.

Source electrodes and drain electrodes may be separated from a gate electrode by a gate dielectric as shown in FIG. 7. In one embodiment, the source and drain electrode may be separated by a semiconductor adjacent to a gate dielectric as shown in FIG. 8. The source and drain electrodes can be a conductive material. Useful materials may include those similarly described for the conductive elements. For example, source electrode and drain electrodes may include aluminum, barium, calcium, chromium, copper, gold, silver, nickel, palladium, platinum, titanium, alloys, multilayers, and combinations thereof. In one embodiment, the source electrode and the drain electrode both comprise aluminum, gold, copper, silver, titanium, chromium, metal oxides, doped semiconductors, or combinations thereof. Useful means for application of the source electrodes and drain electrodes may comprise vapor deposition, solution deposition, spin coating, printing techniques, and combinations thereof.

In one aspect, a process is provided for forming a plurality of gate structures. A web is provided that comprises a substrate, a plurality of conductive elements disposed on the substrate, and a conductive anodization bus. The conductive anodization bus is adjacent to a first edge of the substrate. A first conductive element and at least one second conductive elements are electrically connected to the conductive anodization bus. The web is moving, where the web is delivered with a web delivery roll and received with a web receiving roll. The web extends from the web delivery roll to the web receiving roll, and the web passes from the web delivery roll to the web receiving roll. The web passes through an anodization station. The anodization station comprises a anodization bath having an entry location and an exit location for the web; an electrochemical solution retained within the anodization bath, wherein the electrochemical solution has a surface; a cathode located within the electrochemical solution where the plurality of conductive elements is positioned between the substrate and the cathode; an anode; and a power supply attached to the anode and the cathode. The cathode may be located at a distance from the entry location, where the distance is sufficient to prevent arcing at the entry location by providing a sufficiently low electrical potential in the electrochemical solution at the entry location. The anode comprises the conductive anodization bus positioned above the surface of the electrochemical solution; a plurality of conductive elements where at least a portion of the plurality of the conductive elements are positioned below the surface of the electrochemical solution; and a plurality of clamps, where at least one clamp is in electrical contact with the conductive anodization bus. At least a portion of the surface of the plurality of conductive elements exposed to the electrochemical solution is anodized to form a plurality of gate structures. The plurality of gate structures comprises a plurality of gate dielectrics adjacent to a plurality of gate electrodes. The plurality of gate electrodes is positioned between the plurality of gate dielectrics and the substrate.

In another aspect, a process is provided for forming a plurality of electronic devices. A web is provided that comprises a substrate, a plurality of conductive elements disposed on the substrate, and a conductive anodization bus. The conductive anodization bus is adjacent to a first edge of the substrate. A first conductive element and at least one second conductive elements are electrically connected to the conductive anodization bus. The web is moving, where the web is delivered with a web delivery roll and received with a web receiving roll. The web extends from the web delivery roll to the web receiving roll, and the web passes from the web delivery roll to the web receiving roll. The web passes through an anodization station. The anodization station comprises an anodization bath having an entry location and an exit location for the web; an electrochemical solution retained within the anodization bath, wherein the electrochemical solution has a surface; a cathode located within the electrochemical solution where the plurality of conductive elements is positioned between the substrate and the cathode; an anode; and a power supply attached to the anode and the cathode. The cathode may be located at a distance from the entry location, where the distance is sufficient to prevent arcing at the entry location by providing a sufficiently low electrical potential in the electrochemical solution at the entry location. The anode comprises the conductive anodization bus positioned above the surface of the electrochemical solution; a plurality of conductive elements where at least a portion of the plurality of the conductive elements are positioned below the surface of the electrochemical solution; and a plurality of clamps, where at least one clamp is in electrical contact with the conductive anodization bus. At least a portion of the surface of the plurality of conductive elements exposed to the electrochemical solution is anodized to form a plurality of gate structures. The plurality of gate structures comprises a plurality of gate dielectrics adjacent to a plurality of gate electrodes. The plurality of gate electrodes is positioned between the plurality of gate dielectrics and the substrate. The process further comprises providing a semiconductor adjacent to the plurality of gate dielectrics. A source electrode and a drain electrode are both provided adjacent to the surface of the semiconductor opposite the plurality of gate structures, where the source electrode is not in contact with the drain electrode.

In another aspect, a process is provided for forming a plurality of electronic devices. A web is provided that comprises a substrate, a plurality of conductive elements disposed on the substrate, and a conductive anodization bus. The conductive anodization bus is adjacent to a first edge of the substrate. A first conductive element and at least one second conductive elements are electrically connected to the conductive anodization bus. The web is moving, where the web is delivered with a web delivery roll and received with a web receiving roll. The web extends from the web delivery roll to the web receiving roll, and the web passes from the web delivery roll to the web receiving roll. The web passes through an anodization station. The anodization station comprises a anodization bath having an entry location and an exit location for the web; an electrochemical solution retained within the anodization bath, wherein the electrochemical solution has a surface; a cathode located within the electrochemical solution where the plurality of conductive elements is positioned between the substrate and the cathode; an anode; and a power supply attached to the anode and the cathode. The cathode may be located at a distance from the entry location, where the distance is sufficient to prevent arcing at the entry location by providing a sufficiently low electrical potential in the electrochemical solution at the entry location. The anode comprises the conductive anodization bus positioned above the surface of the electrochemical solution; a plurality of conductive elements where at least a portion of the plurality of the conductive elements are positioned below the surface of the electrochemical solution; and a plurality of clamps, where at least one clamp is in electrical contact with the conductive anodization bus. At least a portion of the surface of the plurality of conductive elements exposed to the electrochemical solution is anodized to form a plurality of gate structures. The plurality of gate structures comprises a plurality of gate dielectrics adjacent to a plurality of gate electrodes. The plurality of gate electrodes is positioned between the plurality of gate dielectrics and the substrate. The process further comprises providing both a source electrode and a drain electrode adjacent to the plurality of gate dielectrics. A semiconductor is provided adjacent to the surface of both the source electrode and the drain electrode opposite the plurality of gate structures, where the source electrode is not in contact with the drain electrode.

The disclosure will be further clarified by the following examples which are exemplary and not intended to limit the scope of the disclosure.

EXAMPLES

Unless otherwise noted, all parts, percentages, and ratios reported in the following examples are on a weight basis, and all reagents used in the examples were obtained, or are available, from the chemical suppliers described below, or may be synthesized by conventional techniques.

Example 1

Aluminum (Al) was sputtered and patterned on polyethylene-2,6-napthalate ((PEN), 100 micron (μm), Dupont Teijin Films, Japan)) as a substrate, to form a plurality of conductive elements. A web comprises the substrate, conductive elements disposed on the substrate, and a conductive anodization bus parallel to a first edge of the substrate. The plurality of conductive elements was anodized by moving the web through an anodization station. The patterned aluminum conductive elements were anodized as the web was moved through an anodization station.

Prior to deposition of the Al metal, the substrate was degassed with an infrared (IR) tube heater at a web speed of 2.4 meters/minute (m/min). An adhesion layer of 3 nanometer (nm) $SiO_x$ was radio frequency (RF) sputtered on the substrate with a 12.7 cm×38.1 cm planar magnetron $SiO_2$ sputtering target (Angstrom Sciences, Duquesne, Pa.) at a power of 1 kilowatt (kW) and 13.56 megahertz (MHz) having a web speed of 0.305 m/min. The chamber background pressure was 10 millitorr (mTorr) having an argon (Ar) gas flow of 600 standard cubic centimeters (sccm) and an oxygen ($O_2$) gas flow of 7.5 sccm.

Subsequently, 200 nm of aluminum metal was sputtered on the substrate at a web speed of 1.219 m/min. The Al metal was sputtered with a 12.7 cm×38.1 cm planar magnetron sputtering target (Angstrom Sciences, Duquesne, Pa.) having a purity of 99.999% at a DC power of 9 kW. The background chamber pressure was 5 mTorr, with an argon gas flow of 600 sccm. All three steps (degas, $SiO_x$ adhesion layer deposition and Al metal deposition) were done sequentially in a single multi-purpose vacuum coater in one vacuum pump down.

The continuous aluminum layer on a substrate was patterned with negative dry film photoresist (DFPR) using photolithography methods. A 175 micron (μm) dry film photoresist (UGH-072, Asahi Kasei, Japan) was laminated on the aluminum layer coated on the PEN at 206.8 kiloPascal (kPa)), at a temperature of 110° C. at a roll speed of 0.914 m/min. The film was exposed at 100 millijoules (mJ) with a step and repeat exposure unit to a chrome on quartz photomask (Infinite Graphics, Minneapolis, Minn.). Step and repeat exposure units are known in the art. An ORC step and repeat exposure unit known as the Proform 3500 is available from DRC Imaging Corporation of City of Industry, Calif. A similar step and repeat exposure unit was used. The DFPR release layer was removed and the DFPR was developed with sodium carbonate (($Na_2CO_3$), Sigma Aldrich, St. Louis, Mo.) solution with a spray pressure of 27.6 kilopascals (kPa), a temperature of 21° C. at a web speed of 1.524 m/min. The DFPR was baked at 35° C. having a web speed of 1.829 m/min. The aluminum metal was etched with 45 wt. % KOH (Sigma Aldrich, St. Louis, Mo.) at 27.6° C. The DFPR was removed with 4.61 wt. % monoethanolamine ((MEA), Sigma Aldrich, St. Louis, Mo.) at 40° C., and the substrate was rinsed with deionized (DI) water at 32° C. The Al metal etch, DFPR removal and rinse steps were all done inline at a web speed of 2.234 m/min. The web was then cleaned with a liquinox (2 weight (wt.) %, Sigma Aldrich, St. Louis, Mo.)/citric acid (2 wt. %, Sigma Aldrich, St. Louis, Mo.) solution at 120 48.9° C. at a web speed of 0.457 m/min.

The patterned conductive elements were anodized in an anodization station. The station comprises a central tub having a length of 0.914 m, a stainless steel cathode, and a polypropylene baffle. The cathode was approximately 30.54 cm in height, and extended about 65 cm in length parallel to the web. The baffle was located adjacent to the front edge of the cathode. The baffle was about 30.54 cm in height, about 0.70 cm in thickness, and about 20 cm in length. A portion of both the cathode and the baffle extended about 5 cm about the surface of the electrochemical solution. The web was held in a vertical configuration, with anode clamps attaching to the conductive anodization bus for the anode every 14 cm on the web. The potential was set to 75 volts (V) with a maximum allowable current setting of 150 milliamps (mA) and the web speed was 0.076 m/min. The measured current was in the range of 75-110 mA. The electrochemical solution for anodization consisted of a 4:1 (by weight) mixture of ethylene glycol (Sigma Aldrich; St. Louis, Mo.) and 3 wt % tartaric acid (Sigma Aldrich, St. Louis, Mo.) in a deionized water solution that was titrated to a pH of 5.5 with ammonium hydroxide ((NH$_4$OH), Sigma Aldrich, St. Louis, Mo.). The rate of oxide formation for the gate dielectric at room temperature was between 1.2-1.5 nm/V. Samples anodized at a voltage of 75 V produced approximately 980 angstroms (Å) of anodized Al$_2$O$_3$.

The thickness and quality of the anodized Al$_2$O$_3$ gate dielectric adjacent to the gate electrode for forming a gate structure was tested by measuring the leakage of the capacitor structures. Gold top contacts (60 nm) were deposited on the patterned gate electrode and gate dielectric in a vacuum evaporator (CVC Products) through shadow-masks. The top contacts were 6 nm gold circles having diameters of 1 mm, 2 mm, and 5 mm. The current/voltage characteristics were measured with an electrometer (Keithley 2400, Keithley Instruments, Inc., Cleveland, Ohio) in a constant voltage mode. The measured capacitance was 750 picofarads/square millimeter (pF/mm$^2$), and the calculated thickness of the anodized gate dielectric was approximately 100 nm.

Example 2

Thin film transistors were fabricated using the gate structures made using an anodization process of Example 1. The substrate was degassed with an IR tube heater and 3 nm of SiO$_x$ and 200 nm of Al was sputtered under the same conditions and using the same equipment as the conductive metal deposition. The source and drain electrodes were patterned in the same manner as the conductive metal using DFPR (UGH-072, Asahi Kasei, Japan). The conductive metal was patterned using a photomask aligner and exposed at 100 mJ. The DFPR release layer was removed and the DPFR was developed with a sodium carbonate ((Na$_2$CO$_3$), Sigma Aldrich, St. Louis, Mo.) solution with a spray pressure of 27.57 kPa, a temperature of 21.1° C. at a web speed of 152.4 m/min. The DFPR was baked at 100° C. at a web speed of 1.82 m/min. The conductive metal was etched with 45 wt. % potassium hydroxide ((KOH), Sigma-Aldrich, St. Louis, Mo.) at 26.7° C. The DFPR was removed with 4.61 wt. % monoethanolamine ((MEA), Sigma Aldrich, St. Louis, Mo.) at 40° C. and the web was rinsed with deionized water at 32.2° C. The Al metal etch, DFPR removal and rinse steps were all done inline at a web speed of 2.29 m/min. The web was then cleaned with a liquinox (2 wt. %, Sigma Aldrich, St. Louis, Mo.)/citric acid (2 wt. %, Sigma Aldrich, St. Louis, Mo.) solution at 48.9° C. at a speed of 0.457 m/min.

The web was degassed by passing in front of an IR tube heater four times at 2.438 m/min prior to the deposition of a zinc oxide (ZnO) semiconductor. Zinc oxide was sputtered from a ZnO sputtering target (Angstrom Sciences, Duquesne, Pa.) using three passes at 0.305 m/min at a RF power of 1 kW. The chamber pressure was 5 mTorr and the O$_2$ gas was 4 sccm, 6 sccm and 8 sccm with 600 sccm of Ar.

The semiconductor layer was patterned in the same fashion as the conductive elements and the source and drain electrodes using DFPR (UGH-072, Asahi Kasei, Japan), and exposed at 100 mJ with a photomask aligner (Infinite Graphics, Minneapolis, Minn.). The DFPR was exposed using an ORC step and repeat exposure unit (DRC Imaging Corporation, City of Industry, Calif.) utilizing edge fiducials for alignment, and developed with sodium carbonate ((Na$_2$CO$_3$), Sigma Aldrich, St. Louis, Mo.) Zinc oxide (ZnO) was etched with a CAN (Cyantek CR-4S, Syntec, Inc., San Jose, Calif.) etch (Cyantek CR-4S was diluted to 40% volume/volume, resulting in a Ce(IV) concentration=0.064 N and a HNO$_3$ concentration=58 g/L) at room temperature having a web speed of 0.437 m/min. The DPFR was left on the devices and not removed.

Devices on samples implementing three different ZnO deposition conditions (4 sccm O$_2$, 6 sccm O$_2$, and 8 sccm O$_2$) were examined after roll-to-roll patterning. The thin film transistors on the 4 sccm O$_2$ samples were baked for 10 minutes at 115° C. Some of the devices had a mobility of ~0.4 cm$^2$/V-s; I$_{on/off}$(current)~10$^6$, S (voltage decay) ~2 V/decade, and V$_t$ (voltage)~8 V. The TFTs (thin film transistors) on the 6 sccm O$_2$ samples did not require a bake and had device characteristics that were similar to the 4 sccm O$_2$ samples. The 8 sccm O$_2$ samples did not require a bake, but were more resistive in operation. The devices having a demonstrated transistor behavior had a mobility of ~0.001 cm$^2$/V-s.

Various modifications and alterations of this disclosure will be apparent to those skilled in the art without departing from the scope and spirit of this disclosure, and it should be understood that this disclosure is not limited to the illustrative elements set forth herein.

What is claimed is:

1. A process for forming a plurality of gate structures, the process comprising:
    providing a substrate comprising (a) a backing, (b) a plurality of conductive elements disposed on the backing, and (c) a conductive anodization bus parallel to a first edge of the backing, wherein a first conductive element and at least one second conductive element are electrically connected to the anodization bus;
    moving the substrate, wherein the substrate is delivered with a substrate delivery roll and received with a substrate receiving roll, the substrate extends from the substrate delivery roll to the substrate receiving roll, and the substrate passes from the substrate delivery roll to the substrate receiving roll;
    passing the substrate through an anodization station, the anodization station comprising (a) an anodization bath comprising an entry location and an exit location for the substrate, (b) an electrochemical solution retained within the anodization bath, wherein the electrochemical solution has a surface, (c) a cathode located within the electrochemical solution, the plurality of conductive elements positioned between the backing and the cathode, (d) an anode comprising (i) the anodization bus, wherein the anodization bus is positioned above the surface of the electrochemical solution, (ii) the plurality of conductive elements, wherein at least a portion of the plurality of conductive elements are positioned below the surface of the electrochemical solution, and (iii) a plurality of clamps, wherein at least one clamp is in electrical contact with the anodization bus, and (e) a power supply attached to the anode and the cathode; and anodizing at least a portion of the surface of the plurality of conductive elements exposed to the electrochemical solution to form a plurality of gate structures comprising a plurality of gate dielectrics adjacent to a plurality of gate electrodes, the plurality of gate electrodes positioned between the plurality of gate dielectrics and the backing.

2. The process of claim 1, wherein the backing comprises a metal, metal alloy, polyester, polyimide, polyetherimide, liquid crystal polymer, polycarbonate, or combinations thereof.

3. The process of claim 1, wherein the plurality of conductive elements comprises aluminum, tantalum, niobium, zirconium, tungsten, titanium, hafnium, or combinations thereof.

4. The process of claim 1, further comprising a horizontal conveyor to support and move the substrate passing through the anodization station, the horizontal conveyor mounted above the substrate and moving in a plane parallel to a substrate oriented in a vertical plane passing through the anodization bath, wherein the plurality of clamps are mounted to move with the horizontal conveyor.

5. The process of claim 4, wherein the plurality of clamps are aligned with the substrate, the at least one clamp (a) attaching to the anodization bus of the substrate prior to the entry location, (b) moving the substrate through the anodization bath, and (c) releasing the substrate after the exit location, wherein the horizontal conveyor comprises a clamp cam for independently opening and closing the at least one clamp.

6. A process for forming a plurality of electronic devices, the process comprising:

providing a substrate comprising (a) a backing, (b) a plurality of conductive elements disposed on the backing, and (c) a conductive anodization bus parallel to a first edge of the backing, wherein a first conductive element and at least one second conductive element are electrically connected to the anodization bus;

moving the substrate, wherein the substrate is delivered with a substrate delivery roll and received with a substrate receiving roll, the substrate extends from the substrate delivery roll to the substrate receiving roll, and the substrate passes from the substrate delivery roll to the substrate receiving roll;

passing the substrate through an anodization station, the anodization station comprising (a) an anodization bath comprising an entry location and an exit location for the substrate, (b) an electrochemical solution retained within the anodization bath, wherein the electrochemical solution has a surface, (c) a cathode located within the electrochemical solution, the plurality of conductive elements positioned between the backing and the cathode, (d) an anode comprising (i) the anodization bus, wherein the anodization bus is positioned above the surface of the electrochemical solution, (ii) the plurality of conductive elements, wherein at least a portion of the plurality of conductive elements are positioned below the surface of the electrochemical solution, and (iii) a plurality of clamps, wherein at least one clamp is in electrical contact with the anodization bus, and (e) a power supply attached to the anode and the cathode;

anodizing at least a portion of the surface of the plurality of conductive elements exposed to the electrochemical solution to form a plurality of gate structures comprising a plurality of gate dielectrics adjacent to a plurality of gate electrodes, the plurality of gate electrodes positioned between the plurality of gate dielectrics and the backing;

providing a semiconductor adjacent to the plurality of gate dielectrics; and providing both a source electrode and a drain electrode adjacent to a surface of the semiconductor opposite the plurality of gate structures, wherein the source electrode is not in contact with the drain electrode.

7. The process of claim 6, wherein the electronic device is a thin film transistor.

8. The process of claim 6, wherein the electronic device is an active matrix display backplane.

9. The process of claim 6, wherein the semiconductor is inorganic.

10. The process of claim 6, further comprising patterning the semiconductor adjacent to the plurality of gate dielectrics.

11. The process of claim 6, wherein the semiconductor comprises zinc oxide, indium zinc oxide, zinc tin oxide, indium gallium zinc oxide, or combinations thereof.

12. The process of claim 6, wherein both the source electrode and the drain electrode comprise aluminum, gold, copper, silver, titanium, chromium, metal oxides, doped semiconductors, or combinations thereof.

13. A process for forming a plurality of electronic devices, the process comprising:

providing a substrate comprising (a) a backing, (b) a plurality of conductive elements disposed on the backing, and (c) a conductive anodization bus parallel to a first edge of the backing, wherein a first conductive element and at least one second conductive element are electrically connected to the anodization bus;

moving the substrate, wherein the substrate is delivered with a substrate delivery roll and received with a substrate receiving roll, the substrate extends from the substrate delivery roll to the substrate receiving roll, and the substrate passes from the substrate delivery roll to the substrate receiving roll;

passing the substrate through an anodization station, the anodization station comprising (a) an anodization bath comprising an entry location and an exit location for the substrate, (b) an electrochemical solution retained within the anodization bath, wherein the electrochemical solution has a surface, (c) a cathode located within the electrochemical solution, the plurality of conductive elements positioned between the backing and the cathode, (d) an anode comprising (i) the anodization bus, wherein the anodization bus is positioned above the surface of the electrochemical solution, (ii) the plurality of conductive elements, wherein at least a portion of the plurality of conductive elements are positioned below the surface of the electrochemical solution, and (iii) a plurality of clamps, wherein at least one clamp is in electrical contact with the anodization bus, and (e) a power supply attached to the anode and the cathode;

anodizing at least a portion of the surface of the plurality of conductive elements exposed to the electrochemical solution to form a plurality of gate structures comprising a plurality of gate dielectrics adjacent to a plurality of gate electrodes, the plurality of gate electrodes positioned between the plurality of gate dielectrics and the backing;

providing both a source electrode and a drain electrode adjacent to the plurality of gate dielectrics, wherein the source electrode is not in contact with the drain electrode; and providing a semiconductor adjacent to a surface of both the source electrode and the drain electrode, both the source electrode and the drain electrode opposite the plurality of gate.

14. The process of claim 13, wherein the electronic device is a thin film transistor.

15. The process of claim 13, wherein the electronic device is an active matrix display backplane.

16. The process of claim 13, wherein the semiconductor is inorganic.

17. The process of claim 13, further comprising patterning the semiconductor adjacent to the source electrode and the drain electrode.

18. The process of claim 13, wherein the semiconductor comprises zinc oxide, indium zinc oxide, zinc tin oxide, indium gallium zinc oxide, or combinations thereof.

19. The process of claim 13, wherein both the source electrode and the drain electrode comprise aluminum, gold, copper, silver, titanium, chromium, metal oxides, doped semiconductors, or combinations thereof.

20. A process for forming a plurality of gate structures, the process comprising:

providing a substrate comprising (a) a backing, (b) a plurality of conductive elements disposed on the backing, and (c) a conductive anodization bus parallel to a first edge of the backing, wherein a first conductive element and at least one second conductive element are electrically connected to the anodization bus;

moving the substrate, wherein the substrate is delivered with a substrate delivery roll and received with a substrate receiving roll, the substrate extends from the substrate delivery roll to the substrate receiving roll, and the substrate passes from the substrate delivery roll to the substrate receiving roll;

passing the substrate through an anodization station, the anodization station comprising (a) an anodization bath comprising an entry location and an exit location for the substrate, (b) an electrochemical solution retained within the anodization bath, wherein the electrochemical solution has a surface, (c) a cathode located within the electrochemical solution, the cathode located at a distance from the entry location, the distance being sufficient to prevent arcing at the entry location, wherein the plurality of conductive elements is positioned between the backing and the cathode, (d) an anode comprising (i) the anodization bus, wherein the anodization bus is positioned above the surface of the electrochemical solution, (ii) the plurality of conductive elements, wherein at least a portion of the plurality of conductive elements are positioned below the surface of the electrochemical solution, and (iii) a plurality of clamps, wherein at least one clamp is in electrical contact with the anodization bus, and (e) a power supply attached to the anode and the cathode; and anodizing at least a portion of the surface of the plurality of conductive elements exposed to the electrochemical solution to form a plurality of gate structures comprising a plurality of gate dielectrics adjacent to a plurality of gate electrodes, the plurality of gate electrodes positioned between the plurality of gate dielectrics and the backing.

21. A process for forming a plurality of electronic devices, the process comprising:

providing a substrate comprising (a) a backing, (b) a plurality of conductive elements disposed on the backing, and (c) a conductive anodization bus parallel to a first edge of the backing, wherein a first conductive element and at least one second conductive element are electrically connected to the anodization bus;

moving the substrate, wherein the substrate is delivered with a substrate delivery roll and received with a substrate receiving roll, the substrate extends from the substrate delivery roll to the substrate receiving roll, and the substrate passes from the substrate delivery roll to the substrate receiving roll;

passing the substrate through an anodization station, the anodization station comprising (a) an anodization bath comprising an entry location and an exit location for the substrate, (b) an electrochemical solution retained within the anodization bath, wherein the electrochemical solution has a surface, (c) a cathode located within the electrochemical solution, the cathode located at a distance from the entry location, the distance being sufficient to prevent arcing at the entry location, wherein the plurality of conductive elements is positioned between the backing and the cathode, (d) an anode comprising (i) the anodization bus, wherein the anodization bus is positioned above the surface of the electrochemical solution, (ii) the plurality of conductive elements, wherein at least a portion of the plurality of conductive elements are positioned below the surface of the electrochemical solution, and (iii) a plurality of clamps, wherein at least one clamp is in electrical contact with the anodization bus, and (e) a power supply attached to the anode and the cathode;

anodizing at least a portion of the surface of the plurality of conductive elements exposed to the electrochemical solution to form a plurality of gate structures comprising a plurality of gate dielectrics adjacent to a plurality of gate electrodes, the plurality of gate electrodes positioned between the plurality of gate dielectrics and the backing;

providing a semiconductor adjacent to the plurality of gate dielectrics; and providing both a source electrode and a drain electrode adjacent to a surface of the semiconductor opposite the plurality of gate structures, wherein the source electrode is not in contact with the drain electrode.

22. A process for forming a plurality of electronic devices, the process comprising:

providing a substrate comprising (a) a backing, (b) a plurality of conductive elements disposed on the backing, and (c) a conductive anodization bus parallel to a first edge of the backing, wherein a first conductive element and at least one second conductive element are electrically connected to the anodization bus;

moving the substrate, wherein the substrate is delivered with a substrate delivery roll and received with a substrate receiving roll, the substrate extends from the substrate delivery roll to the substrate receiving roll, and the substrate passes from the substrate delivery roll to the substrate receiving roll;

passing the substrate through an anodization station, the anodization station comprising (a) an anodization bath comprising an entry location and an exit location for the substrate, (b) an electrochemical solution retained within the anodization bath, wherein the electrochemical solution has a surface, (c) a cathode located within the electrochemical solution, the cathode located at a distance from the entry location, the distance being sufficient to prevent arcing at the entry location, wherein the plurality of conductive elements is positioned between the backing and the cathode, (d) an anode comprising (i) the anodization bus, wherein the anodization bus is positioned above the surface of the electrochemical solution, (ii) the plurality of conductive elements, wherein at least a portion of the plurality of conductive elements are positioned below the surface of the electrochemical solution, and (iii) a plurality of clamps, wherein at least one clamp is in electrical contact with the anodization bus, and (e) a power supply attached to the anode and the cathode;

anodizing at least a portion of the surface of the plurality of conductive elements exposed to the electrochemical solution to form a plurality of gate structures comprising a plurality of gate dielectrics adjacent to a plurality of gate electrodes, the plurality of gate electrodes positioned between the plurality of gate dielectrics and the backing;

providing both a source electrode and a drain electrode adjacent to the plurality of gate dielectrics, wherein the source electrode is not in contact with the drain electrode; and providing a semiconductor adjacent to a surface of both the source electrode and the drain electrode, both the source electrode and the drain electrode opposite the plurality of gate.

23. A process for forming a plurality of electronic devices, the process comprising:

providing a substrate comprising a plurality of conductive elements electrically connected to a conductive anodization bus; and passing the substrate through an anodization station to form an anodic oxide, the anodization station comprising:

an entry location for the substrate;

an exit location for the substrate; and an electrochemical solution comprising a surface;

a cathode having a voltage, and located within the electrochemical solution at a distance from the entry location, the distance being sufficient to achieve a low potential at the entry location in order to prevent arcing at the entry location; and an anode comprising the conductive anodization bus, wherein at least a portion of the plurality of conductive elements is positioned below the surface of the electrochemical solution.

* * * * *